United States Patent
Kemen et al.

(10) Patent No.: US 9,349,571 B2
(45) Date of Patent: May 24, 2016

(54) PARTICLE OPTICAL SYSTEM

(71) Applicant: Carl Zeiss Microscopy GmbH, Jena (DE)

(72) Inventors: Thomas Kemen, Aalen (DE); Pascal Anger, Aalen (DE); Dirk Zeidler, Oberkochen (DE); Gerd Benner, Aalen (DE)

(73) Assignee: CARL ZEISS MICROSCOPY GMBH, Jena (DE)

( * ) Notice: Subject to any disclaimer, the term of this patent is extended or adjusted under 35 U.S.C. 154(b) by 0 days.

(21) Appl. No.: 14/481,823

(22) Filed: Sep. 9, 2014

(65) Prior Publication Data

US 2015/0069235 A1 Mar. 12, 2015

(30) Foreign Application Priority Data

Sep. 9, 2013 (DE) .......................... 10 2013 014 976

(51) Int. Cl.
*H01J 37/26* (2006.01)
*G21K 5/04* (2006.01)
(Continued)

(52) U.S. Cl.
CPC .............. *H01J 37/265* (2013.01); *H01J 37/04* (2013.01); *H01J 37/10* (2013.01); *H01J 37/1472* (2013.01); *H01J 37/1474* (2013.01); *H01J 37/20* (2013.01);
(Continued)

(58) Field of Classification Search
USPC ............. 250/396 R, 397, 305, 306, 307, 309, 250/310, 311, 492.1, 492.2, 492.3
See application file for complete search history.

(56) References Cited

U.S. PATENT DOCUMENTS 5,430,292 A 7/1995 Honjo et al.
5,892,224 A 4/1999 Nakasuji
(Continued)

FOREIGN PATENT DOCUMENTS

DE 102008062450 A1 6/2010
WO WO 2005/024881 A2 3/2005
(Continued)

OTHER PUBLICATIONS

Partial European Search Report for corresponding European patent application No. 14 003 113.9, dated Feb. 12, 2015.
(Continued)

*Primary Examiner* — Nicole Ippolito
(74) *Attorney, Agent, or Firm* — Alston & Bird LLP

(57) ABSTRACT

A particle optical system comprises a beam generating system (3) configured to generate a plurality of particle beams (5) and to direct the plurality of particle beams (5) onto an object plane (7), a first deflector arrangement (35) arranged in the beam path of the particle beams (5) upstream of the object plane (7) and configured to deflect the plurality of particle beams (5) before they are incident on the object plane (7), an object holder (15) configured to hold an object (17) to be inspected in the object plane (7), a plurality of detectors (27) configured to receive and to detect the plurality of particle beams (5) having traversed the object plane (7), wherein the detectors are arranged in a detection plane (21) on a side of the object plane (7) opposite to the beam generating system (3), at least one first particle optical lens (19) configured to collect particles of the particle beams emanating from the object plane on the detectors (27), and a controller (31) configured to control the first deflector arrangement (35) in order to deflect locations of incidence (9) of the particle beams (5) on the object plane (7) by deflecting the particle beams (5).

18 Claims, 4 Drawing Sheets

(51) Int. Cl.
*H01J 37/10* (2006.01)
*H01J 37/147* (2006.01)
*H01J 37/20* (2006.01)
*H01J 37/244* (2006.01)
*H01J 37/28* (2006.01)
*H01J 37/04* (2006.01)

(52) U.S. Cl.
CPC ............. *H01J 37/244* (2013.01); *H01J 37/28* (2013.01); *H01J 2237/2802* (2013.01)

(56) References Cited

U.S. PATENT DOCUMENTS

| | | |
|---|---|---|
| 2003/0085360 A1 | 5/2003 | Parker et al. |
| 2004/0159787 A1* | 8/2004 | Nakasuji .............. H01J 37/28 250/311 |
| 2005/0029473 A1 | 2/2005 | Muraki et al. |
| 2006/0060782 A1* | 3/2006 | Khursheed .................. 250/310 |
| 2006/0289804 A1 | 12/2006 | Knippelmeyer et al. |
| 2008/0203296 A1 | 8/2008 | Terada et al. |
| 2009/0114818 A1 | 5/2009 | Casares et al. |
| 2009/0159810 A1 | 6/2009 | Knippelmeyer et al. |
| 2009/0256075 A1 | 10/2009 | Kemen et al. |
| 2010/0148087 A1 | 6/2010 | Doering et al. |
| 2010/0320382 A1 | 12/2010 | Almogy et al. |
| 2013/0032729 A1 | 2/2013 | Knippelmeyer |
| 2013/0187046 A1 | 7/2013 | Zeidler et al. |
| 2014/0197322 A1 | 7/2014 | Eder et al. |
| 2014/0224985 A1 | 8/2014 | Rodgers et al. |

FOREIGN PATENT DOCUMENTS

| | | |
|---|---|---|
| WO | WO 2006/126880 A2 | 11/2006 |
| WO | WO 2007/028595 A2 | 3/2007 |
| WO | WO 2007/028596 A1 | 3/2007 |
| WO | WO 2007/060017 A1 | 5/2007 |
| WO | WO 2008/101714 A2 | 8/2008 |
| WO | WO 2011/124352 A1 | 10/2011 |
| WO | WO 2012/041464 A1 | 4/2012 |
| WO | WO 2012/112894 A2 | 8/2012 |
| WO | WO 2012/151288 A1 | 11/2012 |
| WO | WO 2013/032949 A1 | 3/2013 |

OTHER PUBLICATIONS

Carl Zeiss SMT GmbH.
A. Mohammadi-Gheidari et al. "Multibeam scanning electron microscope: Experimental results", Journal of Vacuum Science & Technology, B, vol. 28, No. 6, 2010, pp. 1-6.
German Office Action, with translation thereof, for corresponding DE application No. 10 2013 014 976.2, dated Jul. 7, 2014.
Extended European Search Report for corresponding European patent application No. 14 003 113.9, dated Jun. 12, 2015.

* cited by examiner

PARTICLE OPTICAL SYSTEM

CROSS-REFERENCE TO RELATED APPLICATIONS

The present application claims priority of German Patent Application No. 10 2013 014 976.2, filed Sep. 9, 2013 in Germany, the entire contents of which are incorporated by reference herein.

FIELD

The invention relates to particle optical systems. In particular, the invention relates to particle optical systems in which a particle beam is directed onto an object to be inspected and in which particles of the particle beam having traversed the object are detected.

BACKGROUND

A conventional transmission electron microscope (TEM) has a mode of operation in which a focused electron beam is scanned across a thin object and in which intensities of electrons having traversed the object are detected. The intensities detected in dependence of the various scan position represent a transmission electron microscopic image of the object. This scanning mode of operation of the transmission electron microscope is also referred to as a STEM-mode of operation.

Conventional transmission electron microscopes are optimized to achieve maximum image resolutions at a relatively small image fields and, accordingly, a relatively small number of image locations. However, conventional transmission electron microscopes are less suited to inspect large image fields at high resolutions and a high throughput.

SUMMARY

The present invention has been made taking the above considerations into account.

It is an object of the present invention to provide a particle optical system allowing to obtain image information of a thin object by detecting particles having traversed the object at a relatively high throughput and/or from a relatively large image field.

Embodiments of the present invention provide a particle optical system comprising: a beam generating system configured to generate a plurality of particle beams and to direct the plurality of particle beams onto an object plane, a first deflector arrangement arranged in the beam path of the particle beams upstream of the object plane and configured to deflect the plurality of particle beams before they are incident on the object plane, an object holder configured to hold an object to be inspected in the object plane, a plurality of detectors configured to receive and to detect the plurality of particle beams having traversed the object plane, wherein the detectors are arranged in a detection plane on a side of the object plane opposite to the beam generating system, at least one first particle optical lens configured to collect particles of the particle beams emanating from the object plane on the detectors, and a controller configured to control the deflector arrangement in order to deflect locations of incidence of the particle beams on the object plane by deflecting the particle beams.

The particles forming the particle beams can be charged particles, such as electrons or ions, such as helium ions, for example.

A plurality of particle beams are directed onto the object plane in which the thin object to be inspected can be located. Locations of incidence of the particle beams can be arranged at a distance from each other. The distances between the locations of incidence should be sufficiently large such that the beam bundles of the individual particle beams do not overlap in the object plane. Moreover, the distances between pairs of adjacent particle beams in the object plane can be a multiple of the respective diameters of the particle beams in the object plane.

The locations of incidence can be arranged in a regular pattern, such as a rectangular pattern or a hexagonal pattern. The number of the particle beams can be, for example, greater than 10, greater than 20 or greater than 50. The intensity of each particle beam having traversed the object is detected by a separate detector, such that image information relating to plural locations in the object plane can be simultaneously obtained. This allows to significantly reduce the time necessary for obtaining an image of an image field of a given size as compared to a particle optical system using only one single particle beam.

The plurality of particle beams is scanned across the object plane by the first deflector arrangement, such that, within a scanning operation, each particle beam is directed to a plurality of scan locations, wherein the intensity of the transmitted particles is detected for each scan location. Herein, the plurality of particle beams can be commonly deflected as a beam bundle in order to direct the particle beams onto the plurality of scan locations by controlling, for example, a beam deflector to generate a deflecting field commonly traversed by all particle beams. As an alternative, it is also possible to individually deflect each particle beam by controlling a plurality of beam deflectors, wherein each beam deflector generates a deflecting field traversed by one particle beam. Further, it is possible to provide plural beam deflectors, wherein each beam deflector deflects a group of individual particle beams when the plurality of particle beams is divided into plural groups of particle beams. The deflecting field can be an electric deflecting field or a magnetic deflecting field or a combination of electric and magnetic deflecting fields.

The particle beams are deflected in order to scan the particle beams across the object plane. Herein, it is possible to provide a maximum deflection angle in order to ensure that the particles of a given particle beam will be always incident on the detector or the detectors associated with the given particle beam.

A maximum deflection of the particle beams within the object plane occurring during such scanning operation may correspond to a distance between adjacent locations of incidence of the particle beams in the object plane. The maximum deflection within a scanning operation can be much smaller than the lateral extension of the imaged field of view, accordingly. Such maximum deflection of the particle beams can be achieved, for example, by a symmetric deflection in opposite directions from a non-deflected position of the beams by an amount corresponding to half of the maximum deflection.

An arrangement of a desired number of scan locations can be determined within a given field of view. This number can be, for example, an integer multiple of the number of the particle beams, and the arrangement of the scan locations may correspond, for example, to a regular rectangular array. The scan locations within the field of view can be all scanned within one scanning operation, wherein each individual particle beam is scanned only across a portion of the total field of view.

The at least one first particle optical lens directs the particles emanating from the object plane onto the detectors, wherein a separate detector is associated with each particle beam. In particular, the at least one first particle optical lens focuses the particles emanating from the object plane onto the detectors. Moreover, the system can be configured such that the object plane is imaged by the at least one first particle optical lens into the detection plane.

The particle beams traverse a contiguous vacuum space within a vacuum vessel in which the relevant components of the beam generating system, the object and the detection plane of the detectors are arranged. The controller and some components of the detectors can be arranged outside of the vacuum vessel.

According to exemplary embodiments, the particle optical system comprises a second deflector arrangement arranged in the beam path of the particle beams between the object plane and the detection plane and configured to deflect the plurality of particle beams having traversed the object plane, wherein the controller is further configured to control the second deflector arrangement such that each particle beam is directed onto a separate same detector by deflecting the particle beams deflected by the first deflector arrangement and having traversed the object plane, irrespective of a deflection amount provided by the first deflector arrangement.

There are technological reasons requiring that a finite gap remains between adjacent detectors which can be also understood as pixels of a location sensitive detector. Therefore, there exist locations within the object plane which are imaged onto such gap between adjacent detectors. Particles emanating from such locations in the object plane can not be directed onto a particle sensitive surface of one of the detectors. If a particle beam is incident on such location in the object plane, it is not possible to detect the intensity of the particles of this particle beam having traversed the object plane. This is the reason why the second deflector arrangement is provided which deflects the plurality of particle beams having traversed the object plane such that each particle beam is incident on it's associated detector irrespective of the deflection amount provided by the first deflector arrangement. It is thus possible to obtain image information from all locations of the object plane even when the particle sensitive surfaces of the detectors do not cover the full detection plane onto which the object plane is imaged.

It is possible that also the second deflection arrangement commonly deflects all particle beams as a bundle by controlling, for example, one beam deflector in order to generate a deflection field traversed by all particle beams. It is, however, also possible that each particle beam or each group of plural particle beams is deflected by one of a plurality of individual deflectors which are controlled to generate plural deflection fields, wherein each deflection field is traversed by a single particle beam or a group of particle beams.

As an alternative to the second deflector arrangement, it is also possible to maintain the deflections provided by the first deflection arrangement sufficiently small such that the particle beams are not incident on locations in the object plane which are imaged onto a gap between adjacent detectors. In such situation, it is possible to perform a scanning operation using a maximum deflection angle such that locations imaged onto a gap between adjacent detectors are avoided and to subsequently displace the object in a direction orthogonal to the beam direction by an amount which corresponds to about one half of the scanned amount. Subsequent to the displacement, the particle beams can be directed to those locations which have not yet been scanned.

Further, it is not necessary to provide only one detector associated with each particle beam. It is also possible, to provide plural detectors associated with each particle beam, wherein the intensities detected by the plural detectors can be integrated for obtaining the image information, or these intensities can be processed separately.

According to some embodiments, the beam generating system comprises a separate particle source for generating each of the plurality of particle beams.

According to alternative embodiments, the beam generating system comprises one single particle source for generating a primary particle beam which is directed onto a multi-aperture plate having a plurality of apertures such that the particles of the primary particle beam traversing the individual apertures form the plurality of particle beams downstream of the multi-aperture plate.

According to still further exemplary embodiments, the beam generating system comprises plural particle sources, wherein each of the plural particle sources generates a particle beam which is incident onto a multi-aperture plate having a plurality of apertures forming further divided particle beams.

According to further exemplary embodiments, the beam generating system comprises a plurality of second particle optical lenses, wherein one or more second particle optical lenses are disposed in a beam path of each of the plurality of particle beams, wherein each of the second particle optical lenses is traversed by only one particle beam. With such configuration, it is possible to change the convergence or divergence of the individual particle beams and to shape the particle beams in particular such that they form a focus. Herein, it is in particular possible, to change a position of such focus in a direction of the particle beam by changing the power of the second particle optical lens traversed by the respective particle beam. It is, in particular, possible to focus the particle beams in the object plane such that the spatial resolution with which the image information of the inspected object is obtained can be increased. If the beam generating system comprises a multi-aperture plate having a plurality of apertures, the second particle optical lenses can be provided by applying an electric field between the multi-aperture plate and a further electrode.

The at least one first particle optical lens can be provided by a magnetic field generated by an arrangement of pole pieces and current carrying conductors. Such structure may also generate a magnetic field providing plural particle optical lenses arranged at a distance from each other along the beam path. It is, however, also possible to provide two or more particle optical lenses by two or more separate structures generating individual magnetic fields. According to some embodiments, the first particle optical lens is configured such that the object plane is imaged into the detection plane by this first particle optical lens. According to exemplary embodiments herein, the first particle optical lenses configured such that the object plane is magnified into the detection plane, wherein a magnification factor of the magnified imaging is, for example, greater than two, greater than five or greater than ten.

According to some embodiments herein, the object plane is imaged into the detection plane by two particle optical lenses arranged as a telescope, wherein the object plane is located in a focal plane of a first particle optical lens and the detection plane is located in a focal plane of the second particle optical lens. Such telescope arrangement has an advantage in reducing imaging errors of the imaging.

According to exemplary embodiments, the beam generating system comprises at least one third particle optical lens traversed by all particle beams and arranged in the beam path upstream of the object plane. The at least one third particle optical lens can be used to reduce a distance of the locations of incidence of the particle beams in the object plane from each other. There are technological reasons preventing the generation of particle beams having very small distances from each other. At a given distance of the generated particle beams from each other it is thus possible to produce locations of incidence of the particle beams in the object plane at a distance from each other which is significantly smaller than the distance of the generated particle beams from each other.

According to alternative exemplary embodiments, the beam generating system does not comprise such particle optical lens traversed by all particle beams upstream of the object plane such that the generated particle beams are directly incident on the object plane. With such configuration, a reduction of the distances of the locations of incidence of the particle beams on the object plane relative to the distances of the generated particle beams does not occur, allowing for a large image field.

According to further exemplary embodiments, the first deflector arrangement and/or the second deflector arrangement comprises two deflectors arranged at a distance from each other along the beam path of the particle beams, wherein each deflector generates a deflection field within a region traversed by the particle beams. The two deflectors can be controlled by the controller such that a first deflector of the two deflectors deflects the particle beams in a first direction and the second deflector of the two deflectors deflects the particle beams in a second direction opposite to the first direction. With such configuration, it is possible to generate a beam displacement without changing a direction of the beam.

BRIEF DESCRIPTION OF THE DRAWINGS

The forgoing as well as other advantageous features of the disclosure will be more apparent from the following detailed description of exemplary embodiments with reference to the accompanying drawings. It is noted that not all possible embodiments necessarily exhibit each and every, or any, of the advantages identified herein.

DETAILED DESCRIPTION OF EXEMPLARY EMBODIMENTS

Figure 1:
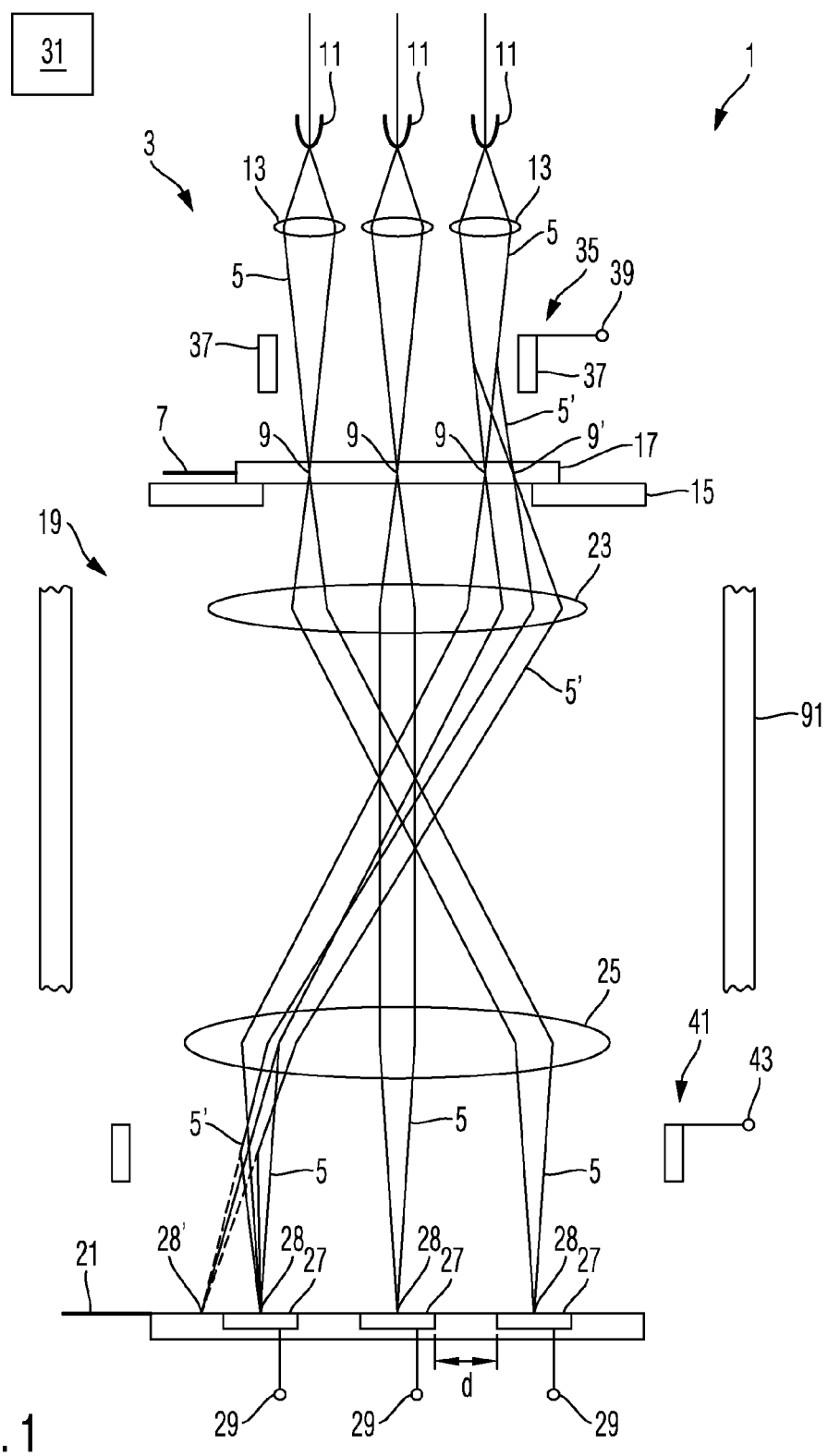
FIG. 1 shows a schematic representation of a particle optical system according to a first embodiment.

In the exemplary embodiments described below, components that are alike in function and structure are designated as far as possible by alike reference numerals. Therefore, to understand the features of the individual components of a specific embodiment, the descriptions of other embodiments and of the summary of the disclosure should be referred to.

A particle optical system 1 schematically illustrated in FIG. 1 comprises a beam generating system 3 for generating a plurality of particle beams 5 and for directing the plurality of particle beams onto an object plane 7. Only three particle beams 5 are shown in FIG. 1 for ease of illustration. These three particle beams 5 are arranged in a row and are incident on the object plane 7 at three locations of incidence 9 arranged along a line. A higher number of particle beams can be used in practice, and the locations of incidence are not necessarily arranged along a line. In particular, the locations of incidence can be distributed within a two-dimensional field in the object plane. For example, the locations of incidence 9 in the object plane 7 can be arranged according to a rectangular lattice or a hexagonal pattern. For example, 5×5=25 or 10×10=100 particle beams 5 can be used.

In the illustrated example, the particle beams are electron beams. It is, however, also possible to provide the particle optical system such that it uses ion beams, such $He^+$-ion beams as the charged particle beams.

Each particle beam 5 is generated by a separate electron source 11 and emerges from the source 11 as a divergent beam. The divergent beam is formed into a convergent beam by a particle optical lens 13 such that a small beam focus is formed in the object plane at the location of incidence 9.

The particle optical system 1 further comprises an object holder 15 configured to hold an object 17 to be inspected in the object plane 7. A suitable object 17 to be inspected is sufficiently thin such that the particles of the particle beams 5 can traverse the object 17. The suitable thickness of the object depends on the composition of the object and the kinetic energy of the incident particles of the particle beams. At low kinetic energies of the electrons of the particle beams 5 of about 20 keV, the thickness of the object is typically with a range from 20 nm to 1000 nm. At higher kinetic energies of the electrons of, for example, 100 keV, the thickness of the object can be within a range from 20 nm to 5000 nm, for example.

The particle optical system 1 further comprises a particle optical lens system 19 configured to image the object plane 7 into an image plane 21. In the illustrated example, the lens system 19 comprises two particle optical lens elements 23 and 25 which are arranged along the beam path of the particle beams on a side of the object plane 7 opposite to the beam generating system 3 such that the particles are incident on the image plane 21 after they have traversed the object plane 7.

In the illustrated example, the object plane 7 is located in the focal plane of the lens element 23, and the image plane is located in the focal plane of the lens element 25. The lens elements 23 and 25 are arranged at a distance from each other which corresponds to a sum of the focal lengths of the lens elements 23 and 25. With such configuration, parallel particle beams traversing the object plane are incident on the image plane also as particle beams, and the beams incident on the image plane are focused at the image plane. An imaging magnification of the particle optical imaging of the object plane into the image plane is defined by a ratio of the focal lengths of the two lens elements 23 and 25.

The particle optical system further comprises a plurality of detectors 27 configured to receive and to detect particles of the particle beams 5 having traversed the object plane 7. The particle sensitive surfaces 27 are arranged in a region of the image plane 21, wherein it is not required that the particle sensitive surfaces 27 exactly coincide with the image plane 21 provided by the particle optical lens system 19 as an image of the object plane. However, the particle sensitive surfaces of the detectors 27 should be arranged sufficiently close to the image plane 21 such that different particle beams 5 are incident on different detection surfaces. In the illustration of FIG. 1, the particle sensitive surfaces of the detectors 27 are exactly located in the image plane 21 such that a focus of the particle beams 5 is formed on the particle sensitive surfaces of the detectors 27 and such that a size of the beam spots in which particles are incident on the particle sensitive surfaces is minimal With such configuration, crosstalk between adjacent detectors 27 can be reduced, and it can also be ensured that the full intensity of each particle beam is detected by the detector 27 associated with the respective particle beam.

The detectors 27 can be semiconductor detectors outputting electric detection signals via connectors 29 connected to a controller 31 of the particle optical system so that this controller can input, process and store the detection signal. According to another example, the particle sensitive surfaces of the detectors 27 are provided by a scintillating material generating light pulses upon incidence of a charged particle, wherein these light pulses are collected by light guides coupled to the scintillator material, and the light guides direct the collected light to light detectors. Other types of detectors for charged particles can be also used.

The particle optical system further comprises a first deflector arrangement 35 arranged in the beam path of the particle beams 5 upstream of the object plane. The first deflector arrangement is configured to deflect the plurality of particle beams before they are incident on the object plane. The first deflector arrangement 35 may comprise, for example, plural electrodes 37 distributed in a circumferential direction about the bundle of particle beams 5. The first deflector arrangement is controlled by the controller 31 and includes one or more control connectors 39 connected to the controller 31.

In the illustration of FIG. 1, the beam paths of the particle beams are shown without deflection by the deflector arrangement 35. Only one exemplary deflected particle beam which carries the reference numeral 5' is shown in FIG. 1. The deflected beam 5' is deflected by the deflector arrangement 35. While only one deflected beam 5' is shown in FIG. 1 for illustrative purposes, the deflector arrangement 35 commonly deflects all particle beams 5 traversing the deflector arrangement, such that all particle beams 5 are deflected in a same manner.

Due to its deflection by the first deflector arrangement 35, the deflected beam 5' is incident on the object plane 7 at a location of incidence 9' arranged at a distance from the location of incidence 9 at which the non-deflected beam 5 is incident on the object plane 7. It is apparent that the particle beams 5 can be scanned across the object plane 7 by the controlled deflection provided by the first deflector arrangement 35. When the object 17 has a structure, the transmission and scattering properties of the object 17 experienced by the particles of the particle beams 5 depend on the location within the object 7 at which the particle beams are incident such that the intensities of charged particles detected by the detector 27 depend on the deflection of the particle beams 5 provided by the first deflector arrangement. By recording the detected particle intensities in dependence of the deflection amount, a transmission electron microscopy image of the object can be obtained, and information relating to the structure of the object can be obtained by analyzing the detected intensities.

The deflected particle beam 5' shown in FIG. 1 also traverses the particle optical lens system 19, wherein the particle beam 5' having traversed the object plane 7 at the location 9' would be incident on the image plane 21 at a location 28' due to the particle optical imaging of the object plane into the image plane, as indicated with broken lines in FIG. 1.

In the illustrated example, the first deflector arrangement 35 comprises one single deflector 37, such that the deflected beam 5' is incident on the object plane at the location of incidence 9' under an angle of incidence which is different from the angle of incidence under which the non-deflected beam 5 is incident on the location 9. Preferably, the first deflector arrangement 35 comprises two deflectors arranged at a distance from each other in a direction of the beams. Two separate deflectors allow to generate a beam displacement such that the deflected beam 5 is incident on the object plane 7 at the location 9' under a same angle under which the non-deflected beam in incident on the location 9. With such arrangement, it is in particular possible that the main axis of the particle beams are always orthogonally oriented relative to the object plane, irrespective of the deflection of the beams. The main axis of a particle beam can be defined as the straight line forming an axis of symmetry of the particle intensities within the beam.

The immediately adjacent particle sensitive regions of the detectors 27 are arranged at a distance d from each other. The remaining distance can not be arbitrarily small due to technological reasons involved in the manufacture of the detectors.

Since the particle sensitive regions of the detectors 27 do not cover the full surface of the image plane 21, it may occur that the deflected particle beam 5' is incident onto the image plane 21 at a location which is outside of the particle sensitive surfaces of the detectors 27. An exemplary location of incidence 28' of the deflected beam 5' outside of the particle sensitive surfaces of the detectors 27 is shown in FIG. 1. This means that image information can not be collected for all locations of incidence 9' in the object plane. For this reason, the particle optical system 1 further comprises a second deflector arrangement 41 provided in the beam path of the particle beams between the object plane 7 and the image plane 21. The second deflector arrangement 41 is configured to deflect the plurality of particle beams 5 having traversed the object plane 7. The second deflector arrangement 41 may have a same or similar configuration as the first deflector arrangement 35 illustrated above. Also the second deflector arrangement 41 is controlled via a connector 43 connected to the controller 31. The second deflector arrangement 41 is controlled by the controller 31 such that the particle beams having traversed the object plane 7 are always incident on the same detector 27, or the particle sensitive surface of the same detector 27, irrespective of an amount of the deflection provided by the first deflector arrangement 35. In the illustration of FIG. 1, the particle beam 5' deflected by the first deflector arrangement 35 is deflected by the second deflector arrangement 41 such that it is incident on the image plane 21 at a same location 28 at which the non-deflected beam 5 is incident on the image plane 21. This allows to detect the intensity of each particle beam 5 having traversed the object plane 7 by the same detector 27 irrespective of the deflection amount provided to this particle beam by the first deflector arrangement 35.

In the illustrated example, the second deflector arrangement 41 is provided in the beam path between the particle lens system 19 formed by the lens elements 23 and 25 and the object plane 21. It is also possible, and preferred in some embodiments, to provide the second deflector arrangement within the particle optical lens system 19 and, in particular such that the deflection occurs within a region in which the focal planes of the two lens elements 23 and 25 are located.

Reference numeral 91 in FIG. 1 designates a wall of a vacuum vessel defining a vacuum space in which the particle sources 11, the object 17 and the detector 27 are commonly housed.

Figure 2:
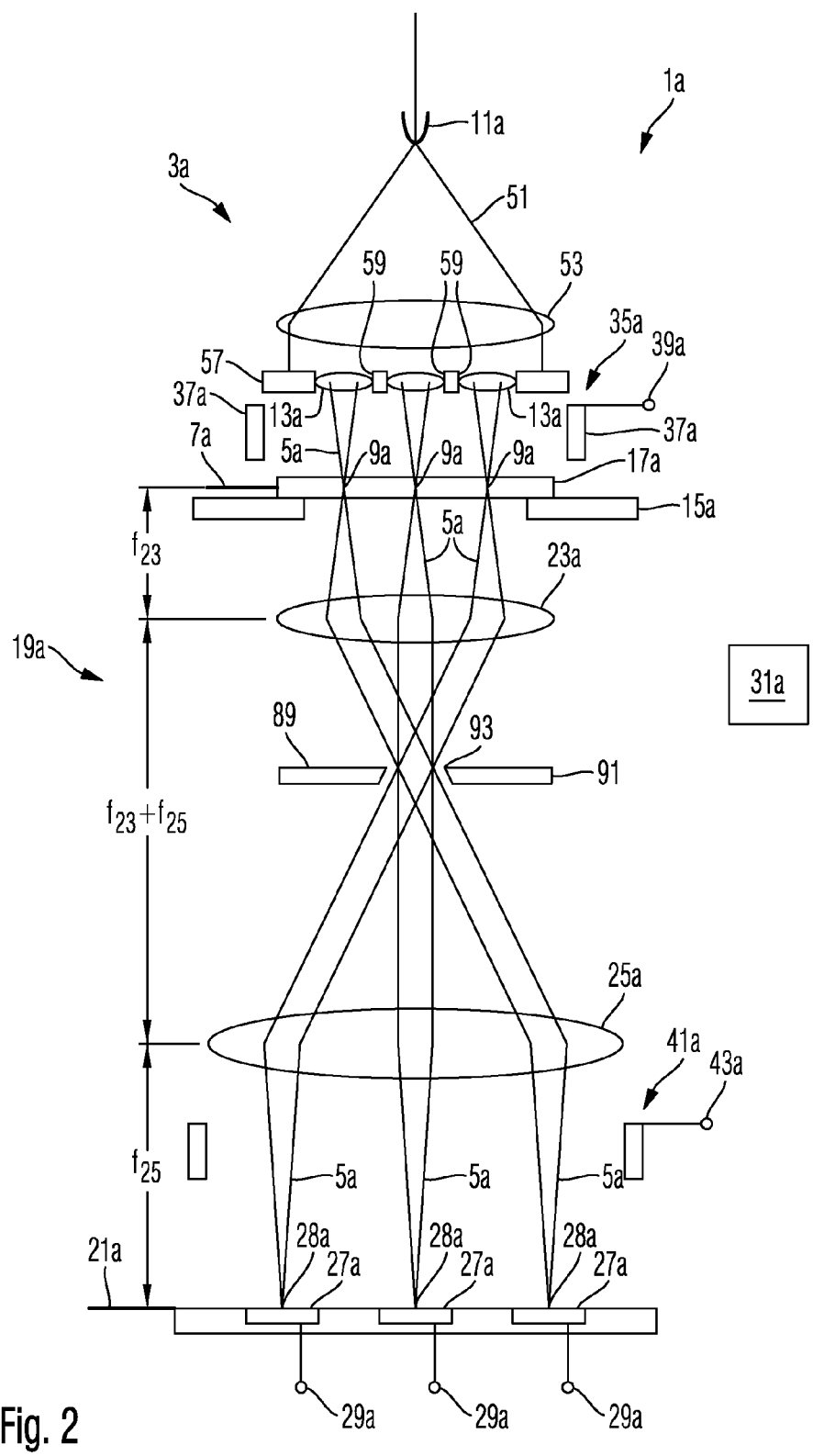
FIG. 2 shows a schematic representation of a particle optical system according to a second embodiment.

A particle optical system 1a schematically illustrated in FIG. 2 has a similar configuration as the system illustrated with reference to FIG. 1 above. The particle optical system 1a differs from the system shown in FIG. 1 mainly in that a beam generating system 3a for generating a plurality of particle beams 5a and for directing the plurality of particle beams 5a onto an object plane 7a comprises a single particle source 11a for generating a single divergent particle beam 51. The divergent particle beam 51 is shaped into a parallel particle beam 55 by a condenser lens 53. A multi-aperture plate 57 is disposed in a beam path of the parallel particle beam 55. The multi-aperture plate 57 includes a plurality of apertures 59 onto which the beam 55 is incident. Portions of the beam 55 may traverse the apertures 59 and form the plurality of particle beams 5a downstream of the multi aperture plate 57. At the same time, the apertures 59 have a function of particle optical lenses such that the particle beams 5a converge after having traversed the multi-aperture plate 57. The particle beams are converged such that they are focused in the object plane 7a and traverse the object plane at locations of incidence 9a.

A first deflector arrangement 35a is disposed in the beam path of the particle beams 5a upstream of the object plane 7a. The deflector arrangement 35a is configured to deflect the particle beams before they are incident on the object plane 7a. As illustrated above with reference to FIG. 1, the first deflector arrangement 35a is controlled by a controller 31a of the particle optical system 1a in order to scan the locations of incidence 9a of the particle beams across the object plane 7a. The locations of incidence 9a in the object plane 7a are imaged into an image plane 21a by a particle optical lens system 19a having two lens elements 23a and 25a. Particle sensitive surfaces of detectors 27a are disposed in the image plane 21a in order to detect intensities of particle beams 5a having traversed the object plane 7a.

A second deflector arrangement 41a is disposed in the beam path of the particle beam between the object plane 7a and the image plane 21a. The second deflector arrangement is configured to deflect the particle beams 5a having traversed the object plane 7a. Also the second deflector arrangement 41a is controlled by the controller 31a such that each of the particle beams 5a having traversed the object plane 7a is incident on one detector 27a associated with the particle beam, irrespective of a deflection amount of the deflection provided to the particle beams by the first deflector arrangement 35a.

The lens system 19a comprises two lens elements 23a and 25a providing a telecentric imaging of the object plane 7a into the detection plane 21a. This is achieved by selecting a distance between the object plane 7a and the lens element 23a such that it corresponds to the focal length f23 of the lens element 23a, by selecting the distance between the two lens elements 23a and 25a such that it corresponds to the sum of the focal lengths f23 and f25 of the lens elements 23a and 25a, and by selecting the distance between the detection plane or image plane, respectively, 21a and the lens element 25a such it corresponds to the focal length f25 of the lens element 25a.

A plate 91 having a circular aperture 93 is disposed in a plane 89 located between the lens elements 23a and 25a at a distance from the lens element 23a corresponding to the focal length f23 of the lens element 23a. The plane 89 is also a diffraction plane relative to the object plane 7a such that the plate 91 can be used to separate bright field electrons having traversed the object plane 7a substantially without scattering at the object 17a from dark field electrons which have been significantly scattered by the object 17a. When the aperture 93 has a circular cross section of a suitable diameter, bright field electrons may traverse the plate 91 while dark field electrons are intercepted by the plate 91. It is also possible to provide the aperture 93 such that it has a ring-shaped cross section, such that dark field electrons may traverse the aperture via the ring-shaped aperture while bright field electrons are intercepted by the central portion of a plate 91.

Figure 3:
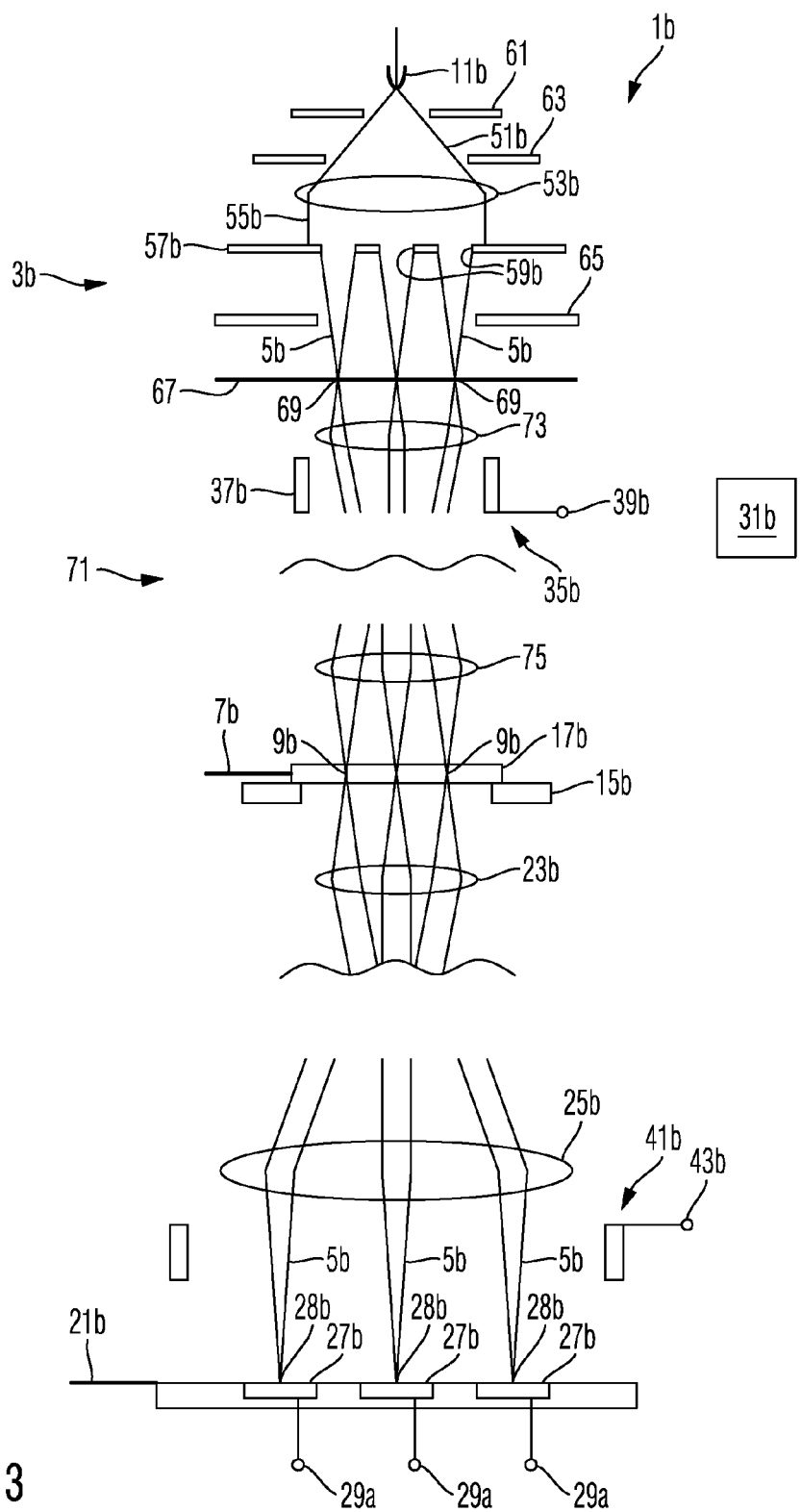
FIG. 3 shows a schematic representation of a particle optical system according to a third embodiment.

A particle optical system 1b schematically illustrated in FIG. 3 has a similar configuration as the system illustrated with reference to FIG. 2 above. In particular, a single particle source 11b is used to generate a particle beam 55b which is incident on a multi-aperture plate 57b having a plurality of apertures 59b in order to generate a plurality of particle beams 5b. FIG. 3 shows an extraction electrode 61 for extracting a divergent particle beam 51b from the source 11b, and an anode 63 for accelerating the particles of the beam 51b to a desired kinetic energy. A further electrode 65 is disposed in the beam path downstream of the multi-aperture plate 57b. The electrode 65 has a central aperture traversed by the plurality of particle beams 5b. Electric potentials applied to the source 11b, the electrodes 61, 63, 65 and the multi-aperture plate 57b are set by a controller 31b of the particle optical system 1b. An electric field generated between the multi-aperture plate 57b and the electrode 65 has an effect that the apertures 59b provide a function of particle optical lenses such that foci 69 of the particle beams 5b are formed in a plane 67 downstream of the multi-aperture plate.

The particle optical system 1b shown in FIG. 3 differs from the embodiments illustrated with reference to FIGS. 1 and 2 above in that an object 17b to be inspected is not disposed in the plane 67. Moreover, a particle optical system imaging the plane 67 into the object plane 7a is provided between the plane 67 and the object plane 7b. Since the plane 67 is imaged into the object plane 7b, also the foci 69 of the particle beams 5b are imaged into foci in the object plane 7b were the particle beams are incident on the object plane 7b at locations of incidence 9b.

In the illustration of FIG. 3, the distances between adjacent foci 69 are equal to distances between adjacent foci 9b, and the imaging of the plane 67 into the object plane 7b has a magnification factor of one for ease of illustration. The imaging system 71 comprises two particle optical lenses 73 and 75 and will provide a demagnifying imaging of the plane 67 into the object plane 17b in practice. With such demagnifying imaging it is possible that a distance between adjacent locations of incidence 9b of the particle beams 5b in the object plane 7b is significantly smaller than a distance between adjacent apertures 59b of the multi-aperture plate 57b.

The embodiments illustrated with reference to FIGS. 1 and 2 above do not include an imaging system 71 having lens elements 73 and 75 traversed by all particle beams as shown in FIG. 3. In the embodiments of FIGS. 1 and 2, the distance between adjacent locations of incidence of the particle beams on the object plane is substantially equal to the distance between adjacent elements used to generate the individual particle beams. Still, also in these embodiments, it is possible that the locations of incidence of the particle beams on the object plane have a smaller distance from each other than the elements used for generating the particle beams. This can be achieved, for example, when the beam 55 incident on the multi-aperture plate 57 shown in FIG. 2 is a convergent beam rather than a parallel beam. If the beam 55 incident on the multi-aperture plate 57 is a convergent beam, also the particle beams formed downstream of the multi-aperture plate 57 will converge, such that the distance between adjacent beams reduces with increasing distance from the multi-aperture plate.

Also the particle optical system 1b comprises a first deflector arrangement 35b for deflecting the particle beams 5b upstream of the object plane 7b, and a second deflector arrangement 41b for deflecting the particle beams 5b between the object plane 7b and an image plane 21b. The detectors 27b are provided for detecting intensities of the particle beams 5b having traversed the object plane 7b. The controller 31b controls the first deflector arrangement 35b in order to change the locations of incidence 9b of the particle beams 5b on the object plane 7b by deflecting the particle beams 5b upstream of the object plane 7b. Moreover, the controller 31b controls the second deflector arrangement 41b such that each particle beam 5b of the plurality of particle beams having traversed the object plane 7b is always incident on the same detector 27b associated with this particle beam, irrespective of an amount of deflection provided to the particle beams by the first deflector arrangement 35b.

Figure 4:
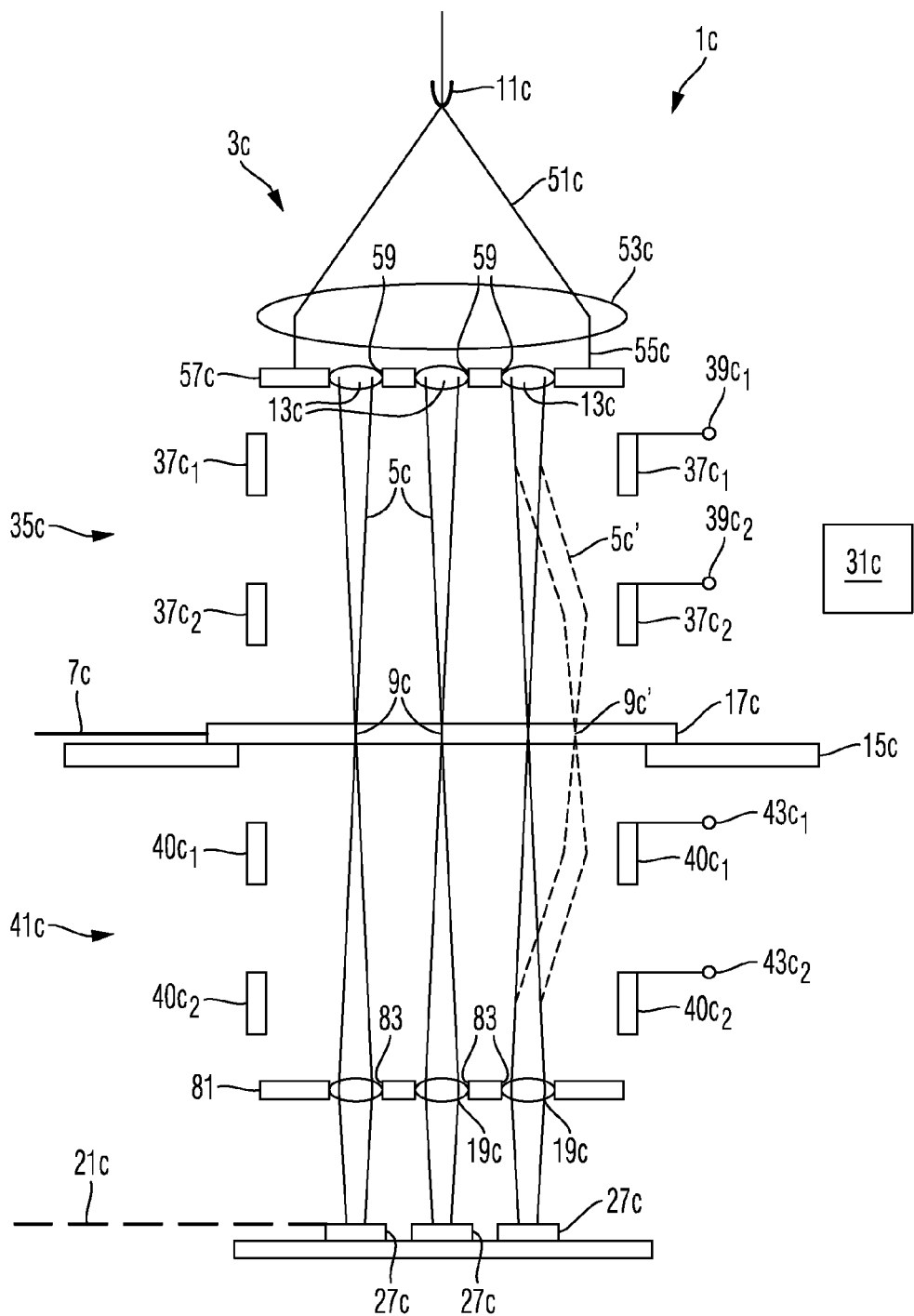
FIG. 4 shows a schematic representation of a particle optical system according to a fourth embodiment.

A particle optical system 1c shown in FIG. 4 has a similar configuration as the system illustrated above with reference to FIG. 2. In particular, a beam generating system 3c for generating a plurality of particle beams 5c and for directing the plurality of particle beams onto an object plane 7c comprises a particle source 11c for generating a divergent particle beam 51c formed into a parallel or collimated particle beam 55c by a condenser lens 53c. A multi-aperture plate 57c is disposed in a beam path of the parallel particle beam 55c. The multi-aperture plate 57c comprises a plurality of apertures 59c such that particles of the beam 55c traversing the apertures 59c form the plurality of particle beams 5c downstream of the multi-aperture plate 57c. Moreover, the apertures 59c have an effect of forming particle optical lenses 13c focusing the particle beams 5c such that particle beam foci are formed at locations of incidence 9c of the particle beams on the object plane 7c.

An object mount 15c carries an object 17c to be inspected such that it is located in the object plane 7c. Particle beams 5c having traversed the object 17c are incident on detectors 27c having particle sensitive surfaces located in a detection plane 21c.

Each particle beam of the plurality of particle beams is always incident on a same detection surface of a detector associated with the particle beam if one detector is associated with one particle beam. Alternatively, each particle beam is always incident on the same detection surfaces of plural detectors if plural detectors are associated with one particle beam. Each particle beam is incident on the same detector\(s), irrespective of deflection amounts generated by the first deflector arrangement $37c_1$, $37c_2$.

The particle beam system 1c differs from the embodiments illustrated with reference to FIGS. 1 to 3 above in that a lens system imaging the object plane 7c into the detection plane 21c and including one or more lens elements traversed by all particle beams of the plurality of particle beams is not provided. However, the particle optical system 1c comprises a plurality of particle optical lenses 19c, wherein each of the plurality of particle optical lenses 19c is traversed by one particle beam 5c in order to direct the particle beam 5c onto one of the detectors 27c. The particle optical lenses 19c are provided by apertures 83 of a second multi-aperture plate 81 located in the beam path between the object plane 7c and the detection plane 21c. The particle beams 5c which are focused as convergent beams onto the object plane 9c are divergent beams immediately downstream of the object plane. The particle optical lenses 19c reduce the divergence of the particle beams or shape the divergent particle beams to form convergent beams subsequent to their traversal of the particle optical lenses 19c. This allows to reduce the diameter of the particle beams incident on the detection plane 21c such that each particle beam is fully incident on a particle sensitive region of the associated detector 27c. It is also possible that each lens 19c images a portion of the object plane 7c into the detection plane 21c such that foci of the particle beams 5c are formed in the detection plane 21c. This is not required, however. Moreover, it can be advantageous if the beam foci formed on the detectors 27c are not too small and that extended regions of the detections surfaces of the detector 27c are used for detecting particle intensities. A first deflector arrangement 35c is disposed in the beam path between the particle source 11c and the object plane 7c in order to deflect the plurality of particle beams before they are incident onto the object plane. The deflector arrangement comprises two deflectors disposed at a distance from each other along the beam path of the particle beams and include electrodes $37c_1$, $37c_2$ and connectors $39c_1$ and $39c_2$ connected to a controller 31c. One of the three particle beams 5c shown in FIG. 4 is shown as a deflected particle beam 5c in broken lines in FIG. 4. The first deflector in the beam path including the electrodes $37c_1$ deflects the beam 5c' in a first direction while the subsequent second deflector in the beam path having the electrode $37c_2$ deflects the beam 5c' into an opposite second direction such that the axes of the beam 5c' incident onto the object plane 7c at a location of incidence 9c' is orthogonal to the object plane 7c.

A second deflector arrangement 41c is provided in the beam path between the object plane 7c and the detection plane 21c for ensuring that each deflected beam is always incident on its associated detector 27c. Also the second deflector arrangement 21c comprises two deflectors having electrodes $40c_1$ and $40c_2$ and connectors $43c_1$, $43c_2$ connected to the controller 31c. Also the deflectors having the electrodes $40c_1$ and $40c_2$ deflect the beams 5c subsequent to their traversal of the object plane 7c in opposite directions, such that the deflection of the beams provided by the first deflector arrangement 35c is compensated and each particle beam 5c is always incident on the same detector 27c associated with the beam.

The charged particle beam system 1c shown in FIG. 4 has one single particle source, and a multi-aperture plate is used to generate the plurality of particle beams. It is, however, also possible to provide plural particle sources as illustrated with reference to FIG. 4 in order to generate the plurality of particle beams 5c in the particle beam system 1c.

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure as defined in the following claims.

What is claimed is:

1. A particle optical system comprising:
 a beam generating system configured to generate a plurality of separate particle beams and to direct the plurality of particle beams onto an object plane;
 a first deflector arrangement arranged in the beam path of the particle beams upstream of the object plane and configured to deflect the plurality of particle beams before they are incident on the object plane;
 an object holder configured to hold an object to be inspected in the object plane;
 a plurality of detectors configured to receive and to detect the plurality of particle beams having traversed the object plane, wherein particle sensitive surfaces of the detectors are arranged in a detection plane on a side of the object plane opposite to the beam generating system;
 at least one first particle optical lens configured to collect particles of the particle beams emanating from the object plane on the detectors; and
 a controller configured to control the first deflector arrangement in order to deflect locations of incidence of the particle beams on the object plane by deflecting the particle beams.

2. The particle optical system according to claim 1, further comprising a second deflector arrangement arranged in the beam path of the particle beams between the object plane and the detection plane and configured to deflect the plurality of particle beams having traversed the object plane;

wherein the controller is further configured to control the second deflector arrangement such that each particle beam is directed onto a separate same detector by deflecting the
particle beams deflected by the first deflector arrangement and having traversed the object plane, irrespective of a deflection amount provided by the first deflector arrangement.

3. The particle optical system according to claim 1, wherein the beam generating system comprises a separate particle source for each generated particle beam.

4. The particle optical system according to claim 1, wherein the beam generating system comprises a particle source for generating a primary particle beam and a multi-aperture plate having a plurality of apertures arranged in the beam path of the primary particle beam in order to generate the plurality of particle beams.

5. The particle optical system according to claim 1, wherein the beam generating system comprises a plurality of second particle optical lenses, wherein at least one of the second particle optical lenses is arranged in a beam path of each of the plurality of particle beams.

6. The particle optical system according to claim 5, wherein the second particle optical lenses comprise apertures of a multi-aperture plate.

7. The particle optical system according to claim 1, wherein the beam generating system is configured to focus each of the plurality of particle beams in the object plane.

8. The particle optical system according to claim 1, wherein the particle optical system is free of a particle optical lens arranged in the beam path upstream of the object plane and traversed by all particle beams.

9. The particle optical system according to claim 1, wherein the beam generating system comprises at least one third particle optical lens arranged in the beam path upstream of the object plane and traversed by all particle beams.

10. The particle optical system according to claim 1, wherein the at least one first particle optical lens is configured to image the object plane into the detection plane.

11. The particle optical system according to claim 10, wherein the at least one first particle optical lens is configured to image the object plane into the detection plane with a magnification greater than 2.

12. The particle optical system according to claim 10, wherein the at least one first particle optical lens comprises two particle optical lens elements, wherein a first particle optical lens element of the two particle optical lens elements is arranged at a distance from the object plane corresponding to a focal length of the first lens element,
wherein a second particle optical lens element of the two particle optical lens elements is arranged at a distance from the first particle optical lens element corresponding to a sum of the focal length of the first particle optical lens element and a focal length of the second particle optical lens element, and
wherein the detection plane is arranged at a distance from the second particle optical lens element corresponding to the focal length of the second particle optical lens element.

13. The particle optical system according to claim 12, wherein the second deflector arrangement comprises a deflector arranged in the beam path of the plurality of the particle beams between the first and second lens elements and at a distance from the first particle optical lens element corresponding to the focal length of the first particle optical lens element.

14. The particle optical system according to claim 12, further comprising a plate arranged in the beam path of the plurality of the particle beams between the first and second lens elements and at a distance from the first lens element corresponding to the focal length of the first particle optical lens element, wherein the plate has a circular aperture or a ring-shaped aperture.

15. The particle optical system according to claim 1, wherein a plurality of the first particle optical lenses is provided, and wherein one of the first particle optical lenses is arranged in a beam path of each of the plurality of particle beams having traversed the object plane.

16. The particle optical system according to claim 15, wherein the first particle optical lenses comprise apertures of a multi-aperture plate.

17. The particle optical system according to claim 1, wherein the first deflector arrangement comprises two deflectors arranged at a distance from each other in the beam path of the plurality of the particle beams.

18. The particle optical system according to claim 1, wherein at least one of the first deflector arrangement and the second deflector arrangement comprises a plurality of electrodes distributed in a circumferential direction about the plurality of particle beams.

* * * * *